United States Patent
Franz et al.

(10) Patent No.: US 11,284,535 B2
(45) Date of Patent: Mar. 22, 2022

(54) LEAK MITIGATION IN A COOLING SYSTEM FOR COMPUTING DEVICES

(71) Applicant: HEWLETT PACKARD ENTERPRISE DEVELOPMENT LP, Houston, TX (US)

(72) Inventors: John Franz, Houston, TX (US); Harvey Lunsman, Chippewa Falls, WI (US); Benjamin Kufahl, Chippewa Falls, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 13 days.

(21) Appl. No.: 16/556,447

(22) Filed: Aug. 30, 2019

(65) Prior Publication Data

US 2021/0068303 A1 Mar. 4, 2021

(51) Int. Cl.
*G05B 19/042* (2006.01)
*H05K 7/20* (2006.01)
*G06F 1/20* (2006.01)

(52) U.S. Cl.
CPC ....... *H05K 7/20272* (2013.01); *G05B 19/042* (2013.01); *G06F 1/206* (2013.01); *H05K 7/20281* (2013.01); *H05K 7/20781* (2013.01); *H05K 7/20836* (2013.01); *G05B 2219/25252* (2013.01); *G05B 2219/25257* (2013.01); *G05B 2219/25312* (2013.01)

(58) Field of Classification Search
CPC .................................................. G05B 19/042
USPC ........................................................ 700/282
See application file for complete search history.

(56) References Cited

U.S. PATENT DOCUMENTS

| 4,698,728 | A | * | 10/1987 | Tustaniwskyj | ..... | H05K 7/20272 165/104.31 |
| 5,323,847 | A | * | 6/1994 | Koizumi | ............ | H05K 7/20645 165/104.33 |
| 7,304,842 | B2 | * | 12/2007 | Yatskov | .................... | G06F 1/20 165/80.3 |
| 8,655,501 | B2 | | 2/2014 | Vinson et al. | | |
| 9,161,480 | B2 | | 10/2015 | Harrington | | |

(Continued)

FOREIGN PATENT DOCUMENTS

| EP | 2041638 B1 | 9/2009 |
| EP | 2392202 B1 | 12/2014 |
| WO | WO-2019047836 A1 | 3/2019 |

OTHER PUBLICATIONS

Google dictionary and Merriam-Webster dictionary. (Year: 2021).*

*Primary Examiner* — Hien D Khuu
(74) *Attorney, Agent, or Firm* — Hewlett Packard Enterprise Patent Department (57) ABSTRACT

Example implementations relate to a leak mitigation system for a cooling system in a computing infrastructure. The leak mitigation system may include tank that is pre-pressurized, a valve unit fluidly coupled to the tank and a cooling loop, and controller operatively coupled to the valve unit. The cooling loop comprises one or more tubes to facilitate a flow of a coolant to cool one or more computing devices. The controller may detect a leak of the coolant from the cooling loop, and in response to detection of the leak of the coolant, the controller may operate the valve unit to establish a fluid coupling between the tank and the cooling loop to transfer at least a portion of the coolant away from the cooling loop.

12 Claims, 7 Drawing Sheets

(56) References Cited

U.S. PATENT DOCUMENTS

| | | | |
|---|---|---|---|
| 2005/0126747 A1* | 6/2005 | Chu | H05K 7/2079 165/11.1 |
| 2010/0290190 A1* | 11/2010 | Chester | H05K 7/20772 361/701 |
| 2014/0078672 A1* | 3/2014 | Brunschwiler | H05K 7/20772 361/699 |
| 2014/0124190 A1* | 5/2014 | Campbell | F28F 27/02 165/296 |
| 2014/0198452 A1* | 7/2014 | Brunschwiler | H05K 13/00 361/699 |
| 2015/0109734 A1* | 4/2015 | Boday | F28D 15/02 361/699 |
| 2016/0270267 A1* | 9/2016 | Chainer | H05K 7/20327 |
| 2016/0379852 A1* | 12/2016 | Tustaniwskyj | H01L 21/67109 165/296 |
| 2017/0105313 A1* | 4/2017 | Shedd | H05K 7/20309 |
| 2018/0035569 A1 | 2/2018 | Harrington | |
| 2018/0149276 A1* | 5/2018 | Rosaen | B60K 11/02 |
| 2019/0110375 A1* | 4/2019 | Harrington | H05K 7/20781 |

* cited by examiner

LEAK MITIGATION IN A COOLING SYSTEM FOR COMPUTING DEVICES

BACKGROUND

Electronic components (e.g., processing and memory components) included in computing devices, such as servers, may generate heat during their operation. In order to prevent damage to the electronic components, cooling systems have been used in many computing devices to maintain the electronic components at acceptable operational temperatures. Generally, such cooling systems may utilize a cooling fluid to absorb thermal energy from the electronic components. In some instances, the cooling fluid may be a gas, such as air, and may directly contact the electronic component(s) to transfer heat away from the electronic component(s). In other instances, the cooling fluid may be a liquid, such as water or oil, which may be brought into thermal contact with the electronic component(s) via one or more cooling blocks or piping.

BRIEF DESCRIPTION OF THE DRAWINGS

These and other features, aspects, and advantages of the present specification will become better understood when the following detailed description is read with reference to the accompanying drawings in which like characters represent like parts throughout the drawings, wherein.

It is emphasized that, in the drawings, various features are not drawn to scale. In fact, in the drawings, the dimensions of the various features may be arbitrarily increased or reduced for clarity of discussion.

DETAILED DESCRIPTION

The following detailed description refers to the accompanying drawings. Wherever possible, same reference numbers are used in the drawings and the following description to refer to the same or similar parts. It is to be expressly understood that the drawings are for the purpose of illustration and description only. While several examples are described in this document, modifications, adaptations, and other implementations are possible. Accordingly, the following detailed description does not limit disclosed examples. Instead, the proper scope of the disclosed examples may be defined by the appended claims.

The terminology used herein is for the purpose of describing particular examples and is not intended to be limiting. As used herein, the singular forms "a," "an," and "the" are intended to include the plural forms as well, unless the context clearly indicates otherwise. The term "another," as used herein, is defined as at least a second or more. The term "and/or" as used herein refers to and encompasses any and all possible combinations of the associated listed items. It will also be understood that, although the terms first, second, etc. may be used herein to describe various elements, these elements should not be limited by these terms, as these terms are only used to distinguish one element from another unless stated otherwise or the context indicates otherwise. As used herein, the term "includes" means includes but not limited to, the term "including" means including but not limited to. The term "based on" means based at least in part on.

As electronics devices such as central processing units (CPUs), graphical processing units (GPUs), and other electronic components (e.g., memory devices) decrease in size, computing devices, such as servers, are in turn able to increase the number of such electronic components utilized. Likewise, server racks, such as high-density server racks, have been constructed to house an increased number of servers for certain computing applications. Established air-cooling systems, such as computer room air conditioner units, typically are not able to provide a sufficient cooling air flow through such high-density server racks. In addition, generating increased air flow via a forced air method may lead to excessive energy consumption by the fans and/or compressors generating the forced air.

Therefore, liquid cooling may be implemented in such environments due to naturally high heat absorption of liquid coolants. In one implementation, liquid cooling may be carried out by using piping containing a liquid coolant. Such piping may be placed in thermal contact with the electronic components to be cooled. The piping may be placed in thermal contact with cold plates or heat sinks which in-turn are thermally coupled to the electronic components. The piping may further interconnect a multitude of components to form a closed cooling loop. An example closed cooling loop may include a pump to circulate a liquid coolant through one or more server racks to absorb heat generated by the electronic components contained in a plurality of computing devices (e.g., servers) housed in one or more chassis or like enclosures installed in the server racks. The closed cooling loop may further include a heat exchanger to transfer the heat absorbed by the liquid coolant to an external cooling facility.

Although liquid cooling utilizing the closed cooling loop is effective for cooling electronic components in a variety of server implementations, a compromise or breach of the closed cooling loop may result in a leakage of liquid coolant from the closed cooling loop. In such cases, an internal pressure in the closed cooling loop may drive the liquid coolant from the closed cooling loop to the surrounding environment. Generally, the leakage of liquid coolant, if not remedied, will continue until a pressure differential no longer exists between the fluid inside the closed cooling loop and the external atmosphere. In a surrounding environment including electrical equipment or other equipment susceptible to damage from the liquid coolant, such a prolonged leak may result in the damage or destruction of such equipment and considerable expense to repair and replace the equipment.

Accordingly, some implementations have been established in the art to mitigate leaks in closed cooling loops. In one example implementation to address the leak of liquid coolant from the closed cooling loop, valves are placed at the inlet of the piping to each server rack or to each enclosure or chassis in each server rack. Thus, in the event a leak is detected in a particular chassis or server rack, the respective valve permitting flow into such chassis or server rack is closed, thereby preventing the flow of additional liquid coolant to the leak and isolating the leak from the remainder of the closed cooling loop. Although such use of the valves may mitigate the leakage of the liquid coolant from the closed cooling loop, certain drawbacks are apparent from such implementation. For instance, the valves and their associated actuators positioned at the inlet of the piping to each server rack or to each enclosure or chassis in each server rack may occupy a large amount of physical space, thereby eliminating such space for other useful components. In addition, the number of inputs and outputs associated with the valves and actuators to control each valve and actuator adds to the complexity of such an implementation.

In another implementation addressing a leakage of liquid coolant from a closed cooling loop, portions of the closed cooling loop are maintained at a pressure less than atmospheric pressure (i.e., a partial vacuum), such that any leak developing in the portions of the closed cooling loop at a partial vacuum pressure would draw air into the closed cooling loop instead of driving liquid coolant out of the closed cooling loop. However, such an implementation has been found to be ineffective for portions of the closed cooling loop that are not maintained at a partial vacuum. In addition, the equipment provided for maintaining portions of the closed cooling loop at a partial vacuum introduces cost and complexity into the closed cooling loop.

In yet another example, a vacuum pump is used on the cooling loop to prevent leaks and entrain air. While this implementation works at reducing leaks, there are a variety of problems experienced. For instance, the vacuum pump needs to be running continuously to establish and maintain vacuum. Such continuous operation of the vacuum pump consumes more power. Also, the continuous operation of the vacuum pump may cause reliability issues. Furthermore, the cooling loop and an expansion tank disposed in the cooling system operating constantly under vacuum may result in more complex controls program. Moreover, for the vacuum pump to operate effectively, large air vessel may be required in the cooling system. An exposure of a coolant to a large air pocket of the vessel may cause chemistry control problems.

To address the aforementioned issues, the present disclosure presents a leak mitigation system for a computing infrastructure. The leak mitigation system presented herein includes a tank that is to, in operation, be pre-evacuated to a vacuum pressure or pre-charged to a positive pressure. In response to detecting a leak, the leak mitigation system opens the pre-evacuated or pre-charged tank and fluidly couples it to the coolant loop so as to cause some of the liquid coolant of the coolant loop to be sucked out of the coolant loop (the coolant is either sucked up into the tank or entrained out of the loop via a venturi nozzle into a drain path). The sucking out of some of the liquid coolant from the coolant loop reduces the pressure of the coolant remaining inside the loop to slightly below atmospheric pressure, which prevents additional liquid from leaving the coolant loop via the leak.

In particular, the leak mitigation system further includes a valve unit fluidly coupled to the tank and a cooling loop. The cooling loop includes one or more tubes to facilitate a flow of a coolant to cool one or more computing devices. Furthermore, the leak mitigation system includes a controller operatively coupled to the valve unit. In particular, the controller may detect a leak of the coolant from the cooling loop. In response to detection of the leak, the controller operates the valve unit to establish a fluid coupling between the tank and the cooling loop to transfer at least a portion of the coolant away from the cooling loop.

In one example, the tank may be a vacuum tank that is pre-evacuated to a vacuum pressure. Accordingly, when the fluid coupling between the tank and the cooling loop is established, the coolant may be sucked by the tank. Such transfer of the coolant from the cooling loop to the tank advantageously reduces an outflow of the coolant from the cooling loop at the location of the leak.

In another example, the tank may be a tank that is charged to a positive pressure holding a fluid (e.g., air) under pressure. Additionally, in this implementation, the leak mitigation system may further include a drain path including a venturi nozzle, coupled to the cooling loop. The drain path may be fluidly coupled to the cooling loop in the event of the leak. Therefore, when the fluid coupling between the tank and the cooling loop is established in the event of the leak, at least a portion of the coolant from the cooling loop is forced to exit via the venturi nozzle. In particular, a flow of the high-pressure fluid from such positively charged tank via a main inlet of the venturi nozzle causes a suction force at a suction inlet of venturi nozzle. Such a suction force may cause the coolant to enter into the venturi nozzle via the suction inlet. The sucked coolant from the suction inlet of the venturi nozzle may flow along with the pressurized fluid from the tank and may eventually be drained. Advantageously, an outflow of the coolant at the location of the leak may be prevented or reduced.

Additionally, in response to detection of the leak, a pump (hereinafter, "coolant circulation pump") that drives flow of the coolant may also be shut-down. Moreover, in some instances, an expansion tank may be isolated from the cooling loop. These additional acts of shutting-down the coolant circulation pump and isolating the expansion tank may reduce any positive pressure on the coolant in the cooling loop thereby further enhancing effectiveness of leak mitigation by presently contemplated implementation.

Advantageously, use of the pre-pressurized tank, positively charged or negatively charged to the vacuum pressure, may reduce or mitigate leak of the coolant at the location of the leak. This is achieved due to transfer of the coolant away from the cooling loop effected by pre-pressurized tank as described hereinabove. Moreover, shutting-down the coolant circulation pump and isolating the expansion tank may further enhance effectiveness of the leak mitigation in presently contemplated implementation. In particular, in the proposed implementations, the tank once pressurized, during operation, need not be subjected to active pumping in contrast to the known approaches of keeping a cooling loop constantly at partial vacuum which might require constant pumping. In the present case, as there is no need to maintain the cooing loop at partial vacuum, much simpler cooling loop can be designed in comparison to known approaches requiring cooling loop at constant partial vacuum. Therefore, the leak mitigation system, in accordance with aspects of as described herein, aids in efficiently mitigating the leak of the coolant in much simpler and cost effective manner.

Figure 1:
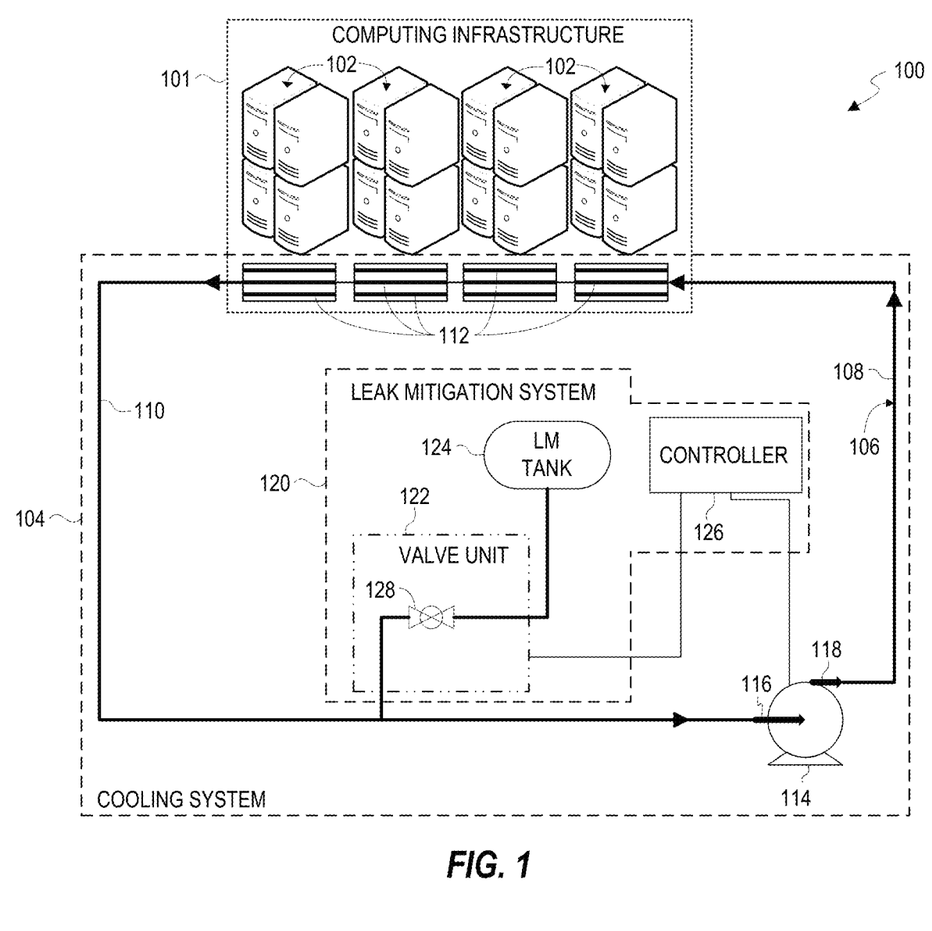
FIG. 1 is a block diagram of a system including a computing infrastructure and a cooling system for the computing infrastructure, in accordance with one example of the present disclosure.

Referring now to the figures, in FIG. 1, a block diagram of a system 100 including a computing infrastructure 101 and a cooling system 104 is depicted, in accordance with one example of the present disclosure. The computing infrastructure 101 may include one or more computing devices 102. For example, the computing devices 102 may be servers and/or electronic storage devices. The computing devices 102 such as server blades may be disposed in one or more server chassis (not shown) mountable on a server rack (not shown). By way of example, the server chassis may be mounted on the server rack in a stacked arrangement, where a plurality of server chassis may be stacked above and below one another. The server rack may be included in a datacenter (not shown). Other examples of the computing devices 102 may also include network devices such as, but not limited to, routers, switches, wireless communication devices/access points, wireless range extenders, repeaters, protocol converters, firewall devices, network gateways, network address translators, multiplexers, network interface controllers, wireless network interface controllers, ISDN terminal adapters, and other related hardware. One or more of the computing devices 102 may include electronic components (not shown) such as, but not limited to, central processing units (CPUs), graphics processing units (GPUs), and memory devices, communication units, power supply and power management units, etc.

In some implementations, the cooling system 104 may be a liquid cooling system and utilized to cool the computing devices 102. In particular, the cooling system 104 may be used to cool the electronic components of the one or more computing devices 102. By way of example, the cooling system 104 of the present disclosure may be utilized to cool electronic components including, but not limited to, CPUs, GPUs, and memory devices, such as dual in-line memory modules (DIMMs). The cooling system 104 may include a cooling loop 106 which includes a supply line 108, a return line 110, a network of one or more tubes 112, and a coolant circulation pump 114. Further, the reference numerals 116 and 118 respectively represent an inlet and an outlet of the coolant circulation pump 114. The inlet 116 and the outlet 118 are hereinafter referred to as a pump inlet 116 and a pump outlet 118.

The network of one or more tubes 112 may be disposed in the computing infrastructure 101 in thermal contact with the computing devices 102 to facilitate a flow of a liquid coolant (hereinafter referred to as a coolant) to cool one or more computing devices 102. In some implementations, the coolant may include water. In some examples, the coolant may include a mixture of water and chemical treatment additives, such as corrosion inhibitors. In certain other implementations, the coolant may be a mixture of water and glycol to prevent freezing of the coolant. The coolant may also be a mixture of water, glycol, and the corrosion inhibitors. By way of example, the coolant may be a propyleneglycol water mixture, such as, PGW 25%. The tubes 112 may be placed in thermal contact with cold plates or heat sinks which in-turn are thermally coupled to the electronic components of the computing devices 102. In one or more implementations, an integrated heat spreader (not shown) may transfer heat from an electronic component mounted to the printed circuit board to a respective cold plate or heat sink from which the heat may be transferred to the coolant contained in the tubes 112. In some implementations, one set of tubes 112 may be disposed in each rack of the computing infrastructure 101. It may be noted that the present disclosure is not limited with respect to any particular arrangement of the tubes 112 in the computing infrastructure 101.

The coolant circulation pump 114 facilitates circulation of the coolant in the cooling loop 106. The coolant circulation pump 114 may be operated by a drive (not shown). The drive may include fixed speed motor or a variable speed motor. In some implementations, the drive may be a variable speed drive (VSD). The coolant circulation pump 114 may draw the coolant from the pump inlet 116 at an inlet pressure and may discharge the coolant from the pump outlet 118 at an outlet pressure that is greater than the inlet pressure. By way of example, the inlet pressure may be about 14.7 psi (1 atm or 101.3 kPa) and the outlet pressure may be about 40 psi (2.72 atm or 275.8 kPa). Accordingly, the pressure in the cooling loop 106 is the greatest at the pump outlet 118, and the pressure in the cooling loop 106 is at a minimum at the pump inlet 116 during standard operation of the cooling system 104. In one or more implementations, a filter (not shown) may be fluidly coupled to the pump outlet 118 to remove particulates from the coolant discharged from the pump outlet 118.

The pump outlet 118 is fluidly coupled to the supply line 108 that supplies the coolant to the network of tubes 112 disposed in the computing infrastructure 101. The term "fluidly coupled" or "fluid coupling" may be referred to as a coupling through which a fluid can be passed. Further, the return line 110 fluidly couples the network of tubes 112 with the pump inlet 116 directly or via additional elements (not shown). During operation, the cool coolant may be supplied to the tubes 112 from the pump outlet 118 via the supply line 108. When the coolant flows via the tubes 112, the coolant absorbs heat from the respective computing devices 102. The heated coolant may then be supplied to the return line 110 from which the coolant flows to the pump inlet 116.

It is apparent that any compromise or breach of a cooling loop in traditional systems may result in a leakage of the coolant. However, in accordance with various examples of the present disclosure, the cooling system 104 of the present disclosure includes a leak mitigation (LM) system 120 in order to prevent spillage of the coolant from the cooling loop 106. The LM system 120 may include a valve unit 122, an LM tank 124, and a controller 126.

As depicted in FIG. 1, the valve unit 122 may be fluidly coupled to the LM tank 124 and the cooling loop 106. The valve unit 122 may include at least one valve, such as, a valve 128 that is fluidly coupled between the LM tank 124 and the cooling loop 106 and may be operated to control flow of a fluid therethrough. For example, the valve 128 shown in FIG. 1 is a ball joint valve. Use of any other type of valve or use of more than one valves is also contemplated within the scope of the present disclosure. The valve 128 may be electronically controlled by the controller 126. At a given point in time, the valve 128 may be operated in one of the two states—an open state and a closed state. The valve 128 allows a fluid to pass therethrough when operated in the open state, thereby establishing a fluid coupling between the cooling loop 106 and the LM tank 124. The valve 128 blocks a passage of the fluid therethrough when operated in the closed state, thereby fluidly decoupling the cooling loop 106 from the LM tank 124.

The LM tank 124 may be representative of an enclosure or a vessel of any design or shape. It may be noted that present disclosure is not limited with respect the type and/or size of the LM tank 124 and the valve 128. The LM tank 124 may be pre-pressurized. For example, in one implementation, the LM tank 124 may be pre-evacuated to a vacuum pressure (i.e., negatively charged) (see FIG. 2). In another example, the LM tank 124 may be pre-charged to a positive pressure in another implementation (see FIG. 3). The LM tank 124, when positively charged, holds a fluid under the positive pressure. After the LM tank 124 has been pre-pressurized to the vacuum pressure or the positive pressure, it substantially maintains that pressure until the valve unit 122 fluidly connects the LM tank 124 to the cooling loop 106.

The controller 126 may be operatively coupled to other components of the cooling system 104. The term "operatively coupled" may refer to a connection between the controller 126 and the components of the cooling system 104 using which the controller 126 may send control signals to the components of the cooling system 104 or receive status/data information from the components of the cooling system 104. For example, the controller 126 may be operatively coupled to the coolant circulation pump 114 and the valve unit 122 via a wired connection as shown in FIG. 1 or via a wireless connection (not shown). In some implementations, the wireless connection may be effected via a network. The network may be a private network or a public network, such as the Internet. As used herein, the public network is a network that may be shared by any number of entities. The public network may have unrestricted access, such that any user may connect to it. The network may include any number of intermediate network devices, such as switches, routers, gateways, and/or servers, which facilitate communication between the controller 126 and the other components of the cooling system 104.

The controller 126 may be implemented using hardware devices, for example, a microcontroller, a microprocessor, central processing unit core(s), application-specific integrated circuit (ASIC), a field programmable gate array (FPGA), etc. to implement various functionalities described herein. The controller 126 may also include any combination of such hardware devices and programming (e.g., instructions stored on machine readable medium) to implement various functionalities described herein. The machine readable medium may be a non-transitory storage medium, examples of which may include, but are not limited to, a random access memory (RAM), a read-only memory (ROM), an electrically erasable programmable read-only memory (EEPROM), a flash memory, a hard disk drive, etc. The controller 126 may execute instructions (i.e., programming or software code) stored on the machine readable medium. Additionally or alternatively, the controller 126 may include electronic circuitry for performing various functionalities described herein.

During operation of the cooling system 104, the controller 126 may detect a leak of the coolant from the cooling loop 106. Various parameters such as pressure, flow rate, temperature, and/or conductivity of the coolant in the cooling loop 106 may be indicative of a leak of coolant from the cooling loop 106. Therefore, in some implementations, the controller 126 may monitor such parameters via one or more sensors/transducers (not shown in FIG. 1, see FIGS. 2-3). The controller 126 may then determine existence of the leak of the coolant based on one or more of the pressure, flow rate, temperature, and/or conductivity of the coolant in the cooling loop 106. It may be noted that the present disclosure is not limited with respect techniques/methods for detecting the leak. Any suitable type of technique/method may be implemented to detect the leak of the coolant.

Further, in response to detection of the leak, the controller 126 may operate the valve unit 122 to establish a fluid coupling between the tank, such as the LM tank 124 and the cooling loop 106 to transfer at least a portion of the coolant away from the cooling loop 106. More particularly, to establish the fluid coupling between the LM tank 124 and the cooling loop 106, the controller 126 may send control signal(s) to the valve unit 122 to operate the valve 128 in the open state. As previously noted, the valve 128, when operated in the open state, allows the flow of fluid therethrough.

In one example, as previously noted, the LM tank 124 may be a vacuum tank that is pre-evacuated to the vacuum pressure. Accordingly, when the fluid coupling between the LM tank 124 and the cooling loop 106 is established, the coolant may be sucked by the LM tank 124. In particular, when the fluid coupling between the LM tank 124 and the cooling loop 106 is established via the valve unit 122, at least the portion of the coolant is transferred to the LM tank 124 from the cooling loop 106 as a result of exposure to the vacuum pressure effected by the LM tank 124. Such transfer of the coolant from the cooling loop 106 to the LM tank 124 advantageously reduces or eliminates an outflow of the coolant from the cooling loop 106 at the location of the leak. In another example, as previously noted, the LM tank 124 may be charged to a positive pressure holding a fluid (e.g., air) under pressure. In such an implementation, the fluid coupling between the cooling loop 106 and the LM tank 124 may cause the coolant to be drained out of the cooling loop 106 to a drain path (not shown in FIG. 1). Advantageously, an outflow of the coolant from the cooling loop 106 at the leak location may be reduced.

Figure 2:
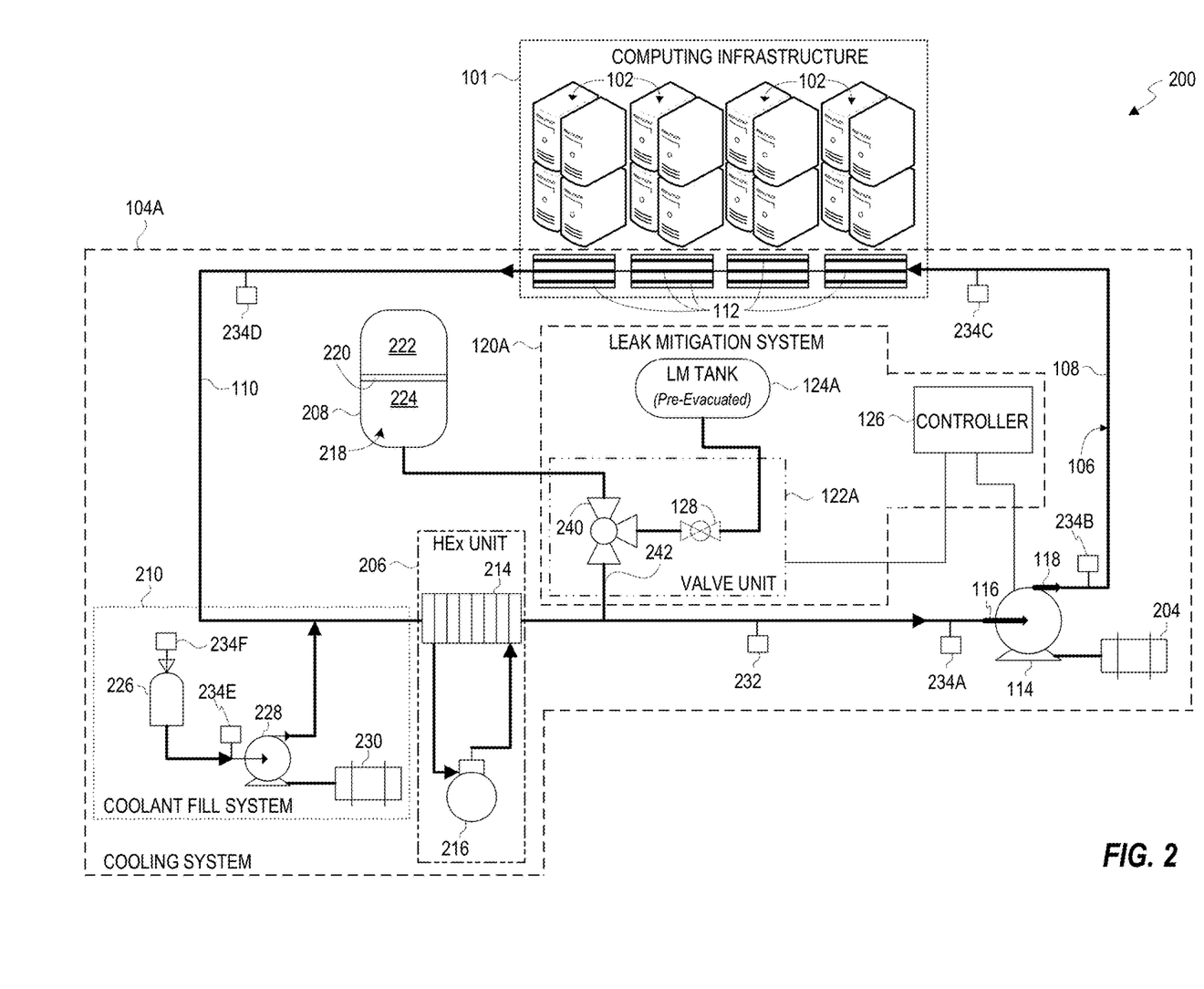
FIG. 2 is a block diagram of a system including a computing infrastructure and a cooling system for the computing infrastructure, in accordance with another example of the present disclosure.

Referring now to FIG. 2, a block diagram of a system 200 including a computing infrastructure 101 and a cooling system 104A is depicted, in accordance with another example of the present disclosure. The system 200 of FIG. 2 may represent one example of the system 100 of FIG. 1 and includes several blocks or components which are similar to the blocks or components already described in FIG. 1, description of which is not repeated herein.

As shown in FIG. 2, the system 200 includes the computing infrastructure 101 and a cooling system 104A disposed in thermal contact with the computing infrastructure 101 to cool the computing devices 102. The cooling system 104A is one implementation example of the cooling system 104 shown in FIG. 1. The cooling system 104A also includes the cooling loop 106 including the supply line 108, the network of tubes 112, the return line 110, and the coolant circulation pump 114 connected in a similar fashion as depicted in FIG. 1. Further, in FIG. 2, a drive 204 to operate the coolant circulation pump 114 is also shown for illustration. The drive 204 may include fixed speed motor or a variable speed motor. In some implementations, the drive may be a variable speed drive (VSD).

In comparison to the cooling system 104 of FIG. 1, the cooling system 104A of FIG. 2 may additionally include a heat exchange unit 206 (marked as "HEx UNIT" in FIG. 2), an expansion tank 208, and a coolant fill system 210. Moreover, the cooling system 104A of FIG. 2 also includes a leak mitigation system 120A (hereinafter referred to as LM system 120A) which is representative of one example of the LM system 120 of FIG. 1.

In some implementations, the heat exchange unit 206 may be disposed along the cooling loop 106. The heat exchange unit 206 may include a heat exchanger 214. The heat exchanger 214 may be disposed along the cooling loop 106 in a location downstream of the computing infrastructure 101 and upstream of the coolant circulation pump 114, as depicted in FIG. 2. In other words, the heat exchanger 214 may be disposed along the return line 110. In one example, the heat exchanger 214 may be disposed in thermal contact with the return line 110. Alternatively, in another example, the heat exchanger 214 may be fluidly coupled along the return line 110, thereby allowing passage of the heated coolant therethrough. The heat exchanger 214 may aid in removing thermal energy (i.e., heat) from the cooling loop 106. In one example, the heat exchanger 214 may be a liquid-to-air heat exchanger which may transfer the heat from the coolant to gas such as air.

The heat exchange unit 206 may further include a cooling apparatus 216 that may be disposed in fluid communication (i.e., fluidly coupled) with the heat exchanger 214. The cooling apparatus 216 supplies a cooling fluid to the heat exchanger 214. The cooling fluid may absorb heat from the coolant flowing through the heat exchanger 214. If the heat exchanger 214 is a liquid-to-air heat exchanger, the cooling fluid may be air. In some other examples, the heat exchanger 214 may be liquid-to-liquid heat exchanger such as, but not limited to, a brazed plate heat exchanger or an open frame heat exchanger. In such implementation, the cooling fluid may be a liquid, such as water.

The expansion tank 208 maintains the inlet pressure of the coolant circulation pump 114 at a predetermined pressure. Maintaining the inlet pressure at the predetermined pressure may be advantageous for preventing cavitation of the coolant circulation pump 114 and the resulting damage to internal components (e.g., blades) of the coolant circulation pump 114. The expansion tank 208 may be selectively fluidly coupled to the pump inlet 116 via a valve, such as, for example, the isolation valve 240 of the LM system 120A, as shown in FIG. 2.

The expansion tank 208 defines a chamber 218 and includes a diaphragm 220 disposed in the chamber 218. The diaphragm 220 may be formed from a flexible material such as rubber, for example. The diaphragm 220 separates the chamber 218 into a gas-filled section 222 and a liquid-filled section 224. In one or more implementations, the gas-filled section 222 may be charged with a gas (such as air) at an initial pressure in the gas-filled section 222 that is equal to the predetermined pressure (for example, about at or above atmospheric pressure) while the expansion tank 208 is fluidly coupled to the cooling loop 106. In examples in which the isolation valve 240 of the LM system 120A is used to fluidly couple the expansion tank 208 to the pump inlet 116, the liquid-filled section 224 is fluidly coupled to the cooling loop 106 while the isolation valve 240 is operated in a first open state (described later), and thus is filled with coolant from the cooling loop 106 at a pressure equal to the inlet pressure for the coolant circulation pump 114. Accordingly, the gas in the gas-filled section 222 may compress or decompress based on the pressure of the coolant in the liquid-filled section 224, and therefore the expansion tank 208 may absorb pressure changes at the pump inlet 116 and thereby maintaining the inlet pressure at (or near) the predetermined pressure. In some examples, the predetermined pressure is about 14.7 psi (101.3 kPa). At such a pressure, pump cavitation may be prevented at the pump inlet 116.

The phrase "maintaining the inlet pressure at (or near) the predetermined pressure" should be understood to mean that the expansion tank 208 tends to offset or absorb pressure changes at the pump inlet 116, but not that the expansion tank 208 necessarily perfectly maintains the inlet pressure at a fixed pressure. In other words, it may be possible for conditions to cause the inlet pressure to move away from the predetermined pressure, despite the expansion tank 208, but the presence of the expansion tank 208 reduces the magnitude of the change in inlet pressure.

In conjunction with the expansion tank 208, the cooling system 104A may further include the coolant fill system 210 to maintain the inlet pressure at the pump inlet 116 at the predetermined pressure. As shown in FIG. 2, the coolant fill system 210 may include a coolant source 226 and a secondary pump 228 fluidly coupling the coolant source 226 to the cooling loop 106. A driver 230 may be coupled with and configured to drive the secondary pump 228. The driver 230 may be a fixed speed motor or a variable speed motor. In one or more implementations, the driver 230 may be a single speed motor.

The coolant source 226 may be a tank or reservoir containing a supply of the coolant. In one or more implementations, the coolant in the coolant source 226 may be same as the coolant flowing through the cooling loop 106. The secondary pump 228 may be activated to draw the coolant from the coolant source 226 to the pump inlet 116 in the cooling loop 106 to provide additional coolant to the cooling loop 106. In one or more implementations, a filter (not shown) may be fluidly coupled to the secondary pump 228 to remove particulates from the coolant to be provided to the cooling loop 106 from the coolant source 226.

Additionally, in some implementations, the cooling system 104A may also include a pressure transducer 232 to measure the pressure at the pump inlet 116. In some examples, in response to the measured inlet pressure being less than the predetermined pressure, the secondary pump 228 may be activated to draw the coolant from the coolant source 226 and to supply the coolant into the cooling loop 106 at the pump inlet 116 until the measured pressure reaches the predetermined pressure. Once the measured inlet pressure is substantially equal to the predetermined pressure, the secondary pump 226 may be shut-down (e.g., powered off). At such time, the inlet pressure may be substantially equal to the pressure in the gas-filled section 222 of the expansion tank 208. Accordingly, the inlet pressure may be maintained at a positive pressure (e.g., the predetermined pressure) even in instances in which the coolant circulation pump 114 is shut-down.

In addition to the pressure transducer 232, the cooling system 104A may include a plurality of sensors 234A, 234B, 234C, 234D, 234E, and 234F (also referred to collectively as sensors 234 or individually and generally as a sensor 234) positioned at a multitude of locations within the cooling loop 106 to detect pressures, flow rates, temperatures, and levels of the coolant at the respective locations of the sensors 234. For example, the cooling system 100 may include one or more sensors 234 in or at the pump inlet 116, the pump outlet 118, the coolant source 226, the supply line 108, and the return line 110. In some examples, the detected pressures, flow rates, temperatures, and conductivity of the coolant may be indicative of a leak of coolant from the cooling loop 106. It may be noted that while the cooling system 104A is shown to include six sensors 234, less than six or more than six sensors may be used as well, within the scope of the present disclosure.

Further, the LM system 120A includes an LM tank 124A, a valve unit 122A, and the controller 126. The LM tank 124A and the valve unit 122A may be representative of one example of the LM tank 124 and the valve unit 122 of FIG. 1. In particular, in the implementation of FIG. 2, the LM tank 124A is a vacuum tank. For example, the LM tank 124A may be a tank that is pre-evacuated to the vacuum pressure. The term "vacuum pressure" as used herein may refer to a pressure that is less than the atmospheric pressure of $1.013 \times 10^5$ Pa (1 atm). In some examples, the vacuum pressure may be a "low vacuum pressure" which is in a range from about $10^5$ pa (0.987 atm) to $3 \times 10^3$ pa (0.03 atm). In some examples, the vacuum pressure may be a "medium vacuum pressure" which is in a range from about $3 \times 10^3$ pa (0.03 atm)

to $1\times10^{-1}$ pa ($9.87\times10^{-7}$ atm). In some examples, the vacuum pressure may be a "high vacuum pressure" which is in a range from about $1\times10^{-1}$ pa ($9.87\times10^{-7}$ atm) to $1\times10^{-7}$ pa ($9.87\times10^{-13}$ atm). In certain examples, the vacuum pressure may be below $1\times10^{-7}$ pa ($9.87\times10^{-13}$ atm).

In some implementations, the LM system 120A may include a vacuum pump (not shown) to maintain the vacuum pressure in the LM tank 124A. The vacuum pump may be operated under the control of the controller 126 when necessary. The vacuum pump may remain inoperative when the vacuum pressure in the LM tank 124A is within a predefined range. In some implementations, the controller 126 may control operation of the vacuum pump depending on the pressure within the LM tank 124A. In some examples, the LM tank 124A and the valve unit 122A may be able to substantially maintain the vacuum pressure within the predefined range for extended periods of time (e.g., hours, days, weeks), and therefore the vacuum pump may be operated infrequently. This represents a substantial improvement over the alternative approach of maintaining the entire cooling loop under partial vacuum, in which a vacuum pump may need to run frequently or even continuously.

In addition to, or in lieu of, the valve 128, the valve unit 122A may include an isolation valve 240. The Isolation valve 240 may be a three-way valve. The isolation valve 240 is fluidly coupled to the cooling loop 106, the valve 128, and the expansion tank 208. The isolation valve 240 may be coupled to the cooling loop 106 via a line/tube 242. In one or more implementations, the line 242 may have an outer diameter of about one inch (2.54 cm) or less. For example, the line 242 may have an outer diameter of about three-fourths of an inch (1.91 cm). In another example, the line 242 may have an outer diameter of about one-half of an inch (1.27 cm). The isolation valve 240 may be operated in three states—a first open state, a second open state, and a closed state. During a normal operation (i.e., when no leak of the coolant is detected) of the cooling system 104A, the isolation valve 240 is operated in the first open state. When operated in the first open state, the isolation valve 240 establishes a fluid coupling between the expansion tank 208 and the cooling loop 106. In some examples, the isolation valve 240 may also isolate the valve 128 and the LM tank 124A from the cooling loop 106 when operated in the first open state. When operated in the second open state, the isolation valve 240 establishes a fluid coupling between the valve 128 and the cooling loop 106 while isolating the expansion tank 208 from the cooling loop 106. If the valve 128 is open (or if the valve 128 is omitted), then operating the isolation valve 240 in the second open state fluidly connects the LM tank 124A with the cooling loop 106. In some examples, when the isolation valve 240 is operated in the closed state it isolates both the expansion tank 208 and the LM tank 124A from the cooling loop 106. Operation of the isolation valve 240 may be controlled by the controller 126.

The controller 126 may be operatively coupled to one or more of the valve unit 122A and the coolant circulation pump 114. Although not shown, the controller 126 may also be operatively coupled to the pressure transducer 232, the sensors 234, the secondary pump 228, and/or the drives 204, 230.

During operation of the cooling system 104A, the controller 126 may poll the pressure transducer 232 and the sensors 234 to receive sensed parameters. By way of example, the pressure transducer 232 may sense instantaneous pressure at the pump inlet 116. Similarly, the sensors 234 may sense parameters such as, but not limited to, pressure, flow rate, temperature, and/or conductivity of the coolant in the cooling loop 106 at respective locations. These sensed parameters may be indicative of the leak of coolant from the cooling loop 106. The controller 126 may then determine existence of the leak of the coolant based on one or more of the pressure, flow rate, temperature, and/or conductivity of the coolant in the cooling loop 106. In particular, the controller 126 may compare measured values of these parameters with respective normal values and/or respective normal ranges. If the measured values of one or more of these parameters deviates from the respective normal values and/or respective normal ranges, the controller 126 may determine that there exists a leak in the cooling loop 106. The leak may occur at any position, for example, the supply line 108, the network of tubes 112, the return line 110, or any joints (fluid couplers—not shown) in the cooling loop 106. It may be noted that the present disclosure is not limited with respect techniques/methods for detecting the leak. Any suitable type of technique/method may be implemented to detect the leak of the coolant.

If the leak is detected, the controller 126 may operate the valve unit 122A to establish a fluid coupling between the LM tank 124A and the cooling loop 106 to transfer at least a portion of the coolant away from the cooling loop 106. In order to establish the fluid coupling between the LM tank 124A and the cooling loop 106, the controller 126 may send control signals/commands to the valve 128 and the isolation valve 240 such that the valve 128 is operated in the open state and the isolation valve 240 is operated in the second open state. The valve 128 and the isolation valve 240 when operated in the open state and the second open state, respectively, establish the fluid coupling between the LM tank 124A and the cooling loop 106. When such fluid coupling is established, the coolant in the cooling loop may be exposed to a suction force caused due to the vacuum pressure in the LM tank 124A. Consequently, at least portion of the coolant from the cooling loop 106 may be sucked by the LM tank 124A due the exposure of the cooling loop 106 to the vacuum pressure form the LM tank 124A. Advantageously, an outflow of the coolant at the location of the leak may be prevented or reduced.

In some examples, the isolation valve 240 when operated in the second open state also isolates the expansion tank 208 from the cooling loop 106. Additionally, in some implementations, in response to detection of the leak, the controller 126 may also suspend the operation of the coolant circulation pump 114 (i.e., shut-down the coolant circulation pump 114), by cutting-down a power supply to the coolant circulation pump 114. Moreover, in some implementations, in response to detection of the leak, if the secondary pump 228 is operational (i.e., pumping the coolant into the cooling loop 106), the controller 126 may further suspend the operation of the secondary pump 228 to stop supply of the additional coolant into the cooling loop 106. Advantageously, shutting-down the pump(s) 114, 228, and isolating the expansion tank 208 from the cooling loop 106, may reduce the pressure in the cooling loop 106 thereby stopping the flow of the coolant from the cooling loop 106 to the surrounding environment at the location of the leak. The leak may be repaired in any manner suitable to return the cooling system 104A to standard operation condition.

Figure 3:
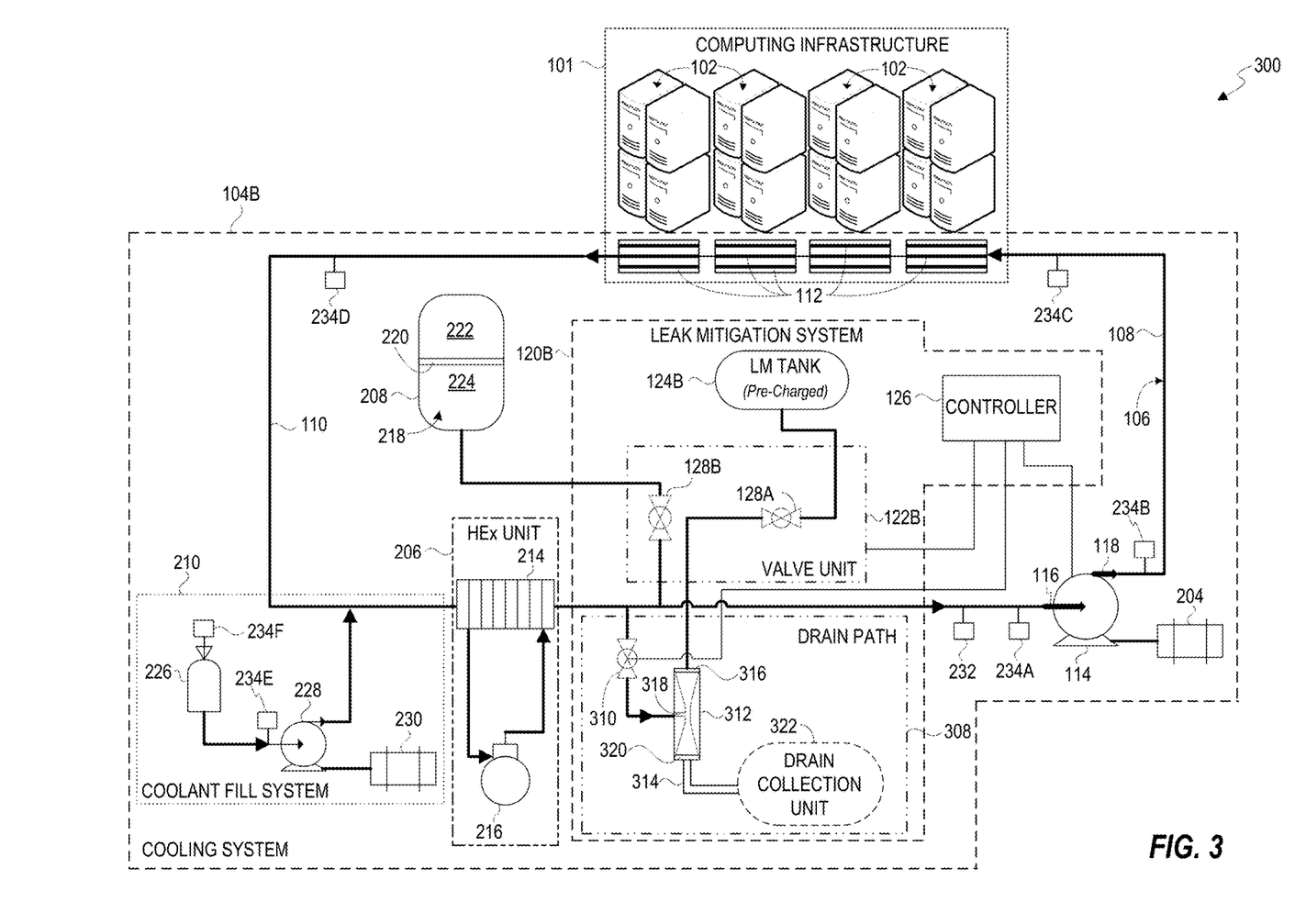
FIG. 3 is a block diagram of a system including a computing infrastructure and a cooling system for the computing infrastructure, in accordance with yet another example of the present disclosure.

Turning now to FIG. 3, a block diagram of a system 300 including a computing infrastructure 101 and a cooling system 104B is depicted, in accordance with another example of the present disclosure. For instance, the system 300 may represent one example of the system 100 of FIG. 1. The system 300 includes several blocks or components which are similar to the blocks or components already described in FIGS. 1 and 2, description of which is not repeated herein. As shown in FIG. 3, the system 300 includes the computing infrastructure 101 and a cooling system 104B disposed in thermal contact with the computing infrastructure 101 to cool the computing devices 102. The cooling system 104B is one example of the cooling system 104. The cooling system 104B also includes the cooling loop 106 including the supply line 108, the network of tubes 112, the return line 110, the coolant circulation pump 114, and the drive 204 connected in a similar fashion as depicted in FIG. 2.

Further, the cooling system 104B of FIG. 3 may also include the heat exchange unit 206, the expansion tank 208, and the coolant fill system 210, as already described in FIG. 2. Furthermore, the cooling system 104B of FIG. 3 also include a leak mitigation system 120B (hereinafter referred to as LM system 120B) which is representative of one example of the LM system 120 of FIG. 1. Further, the LM system 120B of FIG. 3 includes a valve unit 122B, an LM tank 124B, a controller 126, and a drain path 308.

The valve unit 122B is fluidly coupled to the LM tank 124B, the expansion tank 208, and the cooling loop 106. The valve unit 122B is representative of one example of the valve unit 122 of FIG. 1. By way of example, the valve unit 122B of FIG. 3 is shown to include two valves 128A and 128B which are representative of one example of the valve 128 of FIG. 1. In particular, the expansion tank 208 may be fluidly coupled to the cooling loop 106 via the valve 128B. Further, the LM tank 124B may be fluidly coupled to the cooling loop 106 via the valve 128A and the drain path 308.

The LM tank 124B may be representative of an example of the LM tank 124 of FIG. 1. In particular, in the implementation of FIG. 3, the LM tank 124B may be a tank that is pre-charged to a positive pressure (i.e., greater than an atmospheric pressure). The LM tank 124B may hold a fluid under the positive pressure. For example, the fluid may be air. In some implementations, the LM system 120B may include a pump (not shown) to maintain the positive pressure in the LM tank 124B. The pump may be operated under the control of the controller 126 when necessary. The pump may remain inoperative when the pressure in the LM tank 124B is within a predefined range. In some implementations, the controller 126 may control operation of the pump depending on the pressure within the LM tank 124B.

The drain path 308 may include a drain valve 310, a venturi nozzle 312, and a drain conduit 314. The drain valve 310 may be fluidly coupled to the cooling loop 106. By way of example, as shown in FIG. 3, the drain valve 310 may be fluidly coupled between the return line 110 of the cooling loop 106 and the venturi nozzle 312. The drain valve 310 may be electronically controlled by the controller 126. At a given point in time, the drain valve 310 may be operated in one of the two states—an open state and a closed state. The drain valve 310 allows a fluid (e.g., the coolant) to pass therethrough when operated in the open state, thereby establishing a fluid coupling between the cooling loop 106 and the venturi nozzle 312. The drain valve 310 blocks a passage of the coolant therethrough when operated in the closed state, thereby fluidly decoupling the cooling loop 106 from the venturi nozzle 312.

The venturi nozzle 312 includes a main-flow inlet 316, a suction inlet 318, and an outlet 320. The main-flow inlet 316 of the venturi nozzle 312 is fluidly coupled to the valve unit 122B. In particular, the main-flow inlet 316 is fluidly coupled to the valve 128A of the valve unit 122B. Further, the suction inlet 318 is fluidly coupled to the drain valve 310, as shown in FIG. 3. Moreover, the outlet 320 of the venturi nozzle 312 is fluidly coupled to the drain conduit 314.

In some implementations, while one end of the drain conduit 314 is fluidly coupled to the outlet 320 of the venturi nozzle 312, another end of the drain conduit 314 may be left open to allow drain of the coolant. In certain other implementations, the drain 308 path may additionally include a drain collection unit 322. The drain conduit 314 may be terminated into the drain collection unit 322 to allow disposal of the coolant in the event of the leak.

During operation of the cooling system 104B, the controller 126 may poll the pressure transducer 232 and the sensors 234 to receive sensed parameters to detect the leakage of the coolant from the cooling loop 106 in a similar fashion as described in FIG. 2. If the leak is detected, the controller 126 may operate the valve unit 122B to establish a fluid coupling between the LM tank 124B and the cooling loop 106 to transfer at least a portion of the coolant away from the cooling loop 106. The controller 126 may send control signals to the valve unit 122B so as to operate the valve 128B in closed state and to operate the valve 128A in open state. Additionally, the controller 126 may also send control signals to the drain valve 310 to operate the drain valve 310 in the open state. Therefore, when the valve 128B is operated in the closed state, the valve 128A is operated in the open state, and the drain valve 310 is also operated in the open state, the fluid coupling between the LM tank 124B and the cooling loop 106 is established via the venturi nozzle 312. When such fluid coupling is established, at least portion of the coolant from the cooling loop 106 is forced to exit via the venturi nozzle 312 and the drain conduit 314. In particular, a flow of the high-pressure fluid from the LM tank 1246 via the venturi nozzle 312 causes a suction force at the suction inlet 318 of venturi nozzle 312. Such a suction force may cause the coolant to enter into the venturi nozzle 312 via the suction inlet 318. The sucked coolant from the suction inlet 318 may flow along with the pressurized fluid from the LM tank 124B. Advantageously, an outflow of the coolant at the location of the leak may be prevented or reduced.

The mixture of the high-pressure fluid and the coolant may enter into the drain conduit 314. In one implementation where the drain collection unit 322 is not employed, the mixture of the high-pressure fluid and the coolant may exit from the drain conduit 314 into the surrounding of the drain conduit 314. In the implementation where the drain collection unit 322 is used, the mixture of the high-pressure fluid and the coolant may be collected in the drain collection unit 322.

Moreover, in some examples, the valve 128B when operated in the closed state isolates the expansion tank 208 from the cooling loop 106. Additionally, in some implementations, in response to detection of the leak, the controller 126 may also suspend the operation of the coolant circulation pump 114 and the secondary pump 228. Advantageously, shutting-down the pump(s) 114, 228, and isolating the expansion tank 208 from the cooling loop 106, may reduce the pressure in the cooling loop 106 thereby stopping the flow of the coolant from the cooling loop 106 to the surrounding environment at the location of the leak.

Figure 4:
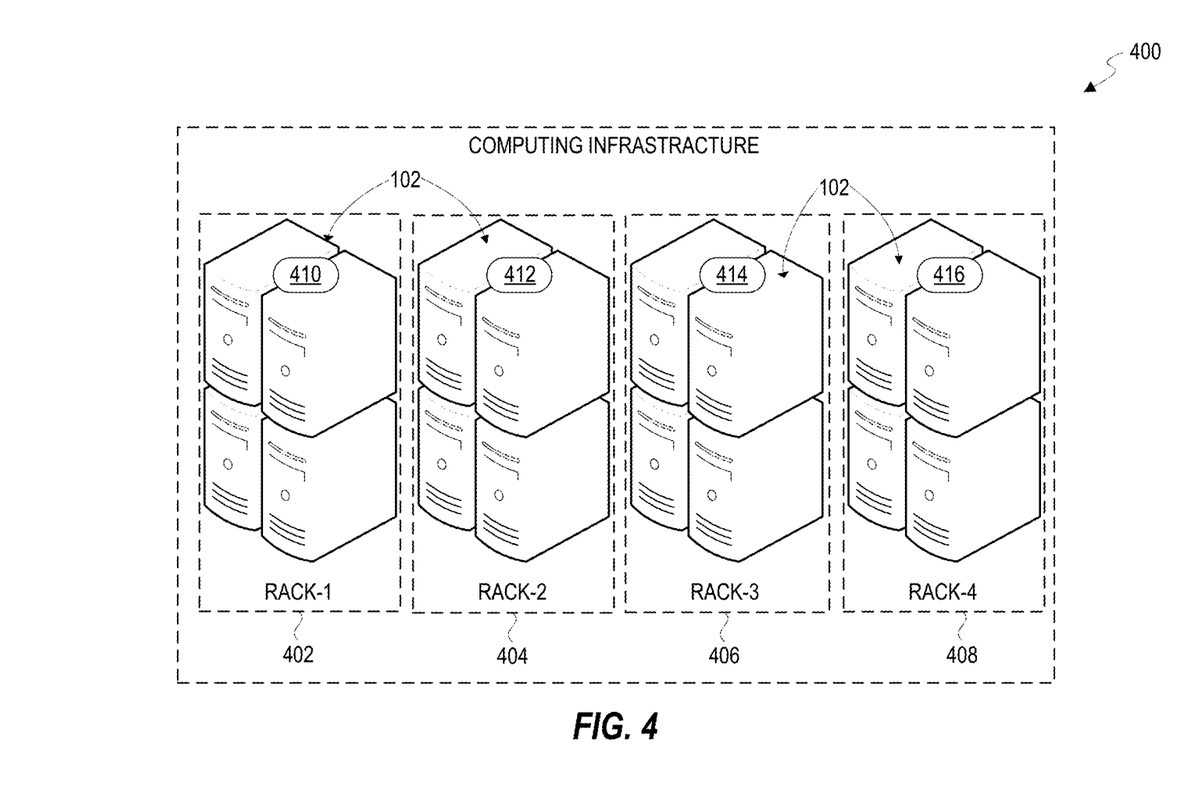
FIG. 4 is a block diagram of computing infrastructure, in accordance with one example of the present disclosure.

Referring now to FIG. 4, a block diagram of a computing infrastructure 400 is presented, in accordance with one example of the present disclosure. It may be noted that the computing infrastructure 400 of FIG. 4 represents one example of the computing infrastructure 100 implemented in FIGS. 1-3. In particular, in the computing infrastructure 400, the computing devices 102 are shown as disposed in a plurality of racks 402, 406, 408, and 410. Although, only four racks are shown in FIG. 4, use of more or fewer number of racks than depicted is also envisioned. Further, for ease of illustration, the network of tubes 112 is not shown in FIG. 4. Also, in order to eliminate complexity of illustration in FIG. 4, these racks 402-410 are simply marked using dashed boxes. By way of example, the racks 402-410 be standard type racks. A standard rack may typically measure about 19 inches wide, 30 inches deep and 74 inches high. The racks 402-410 may be arranged in rows of, for example, roughly 10-30 units, with access doors (not shown) on each side of the racks 402-410. Moreover, access aisles (not shown) are provided on both sides of the rows so that an operator may approach the access doors on each side. In some examples, the racks 402-410 may include sliders (not shown) on which the computing devices 102 may be mounted via mounting fixtures.

By way of example, a plurality of computing devices 102 may be supported in a single stack in each rack 402-410. The racks 402-410 may include a rack assembly having a front door and a back door. Each of the computing devices 102 typically includes a chassis (not shown) having a main board and other components, such as one or more power supplies, hard drives, processors, expansion cards, contained within the chassis. In some implementations, the front door of the rack assembly provides access to the front sides of the computing device 102 and the back door provides access to the back sides, where the I/O ports for the computing devices are typically provided.

Additionally, in some implementations, the computing infrastructure 400 may include distributed LM tanks that may collectively replace the common LM tank such as the LM tank 124, 124A, or 124B. For example, in the implementation of FIG. 4, the distributed tanks may include a plurality of LM tanks 410, 412, 414, 416 that are disposed in the racks 402-408. The LM tanks 410-416 may be representative of the tank LM 124. An LM tank such as the LM tanks 410-416 may be disposed in each rack 402-408 as shown in FIG. 4. The LM tanks 410-416 may be sized such that the LM tanks 410-416 may be able to prevent spill of the coolant in the respective rack. It is understood that fluid coupling of the LM tanks 410-416 with the cooling loop 106 may be controlled using respective valves (not shown) under the control of the controller 126.

Figure 5:
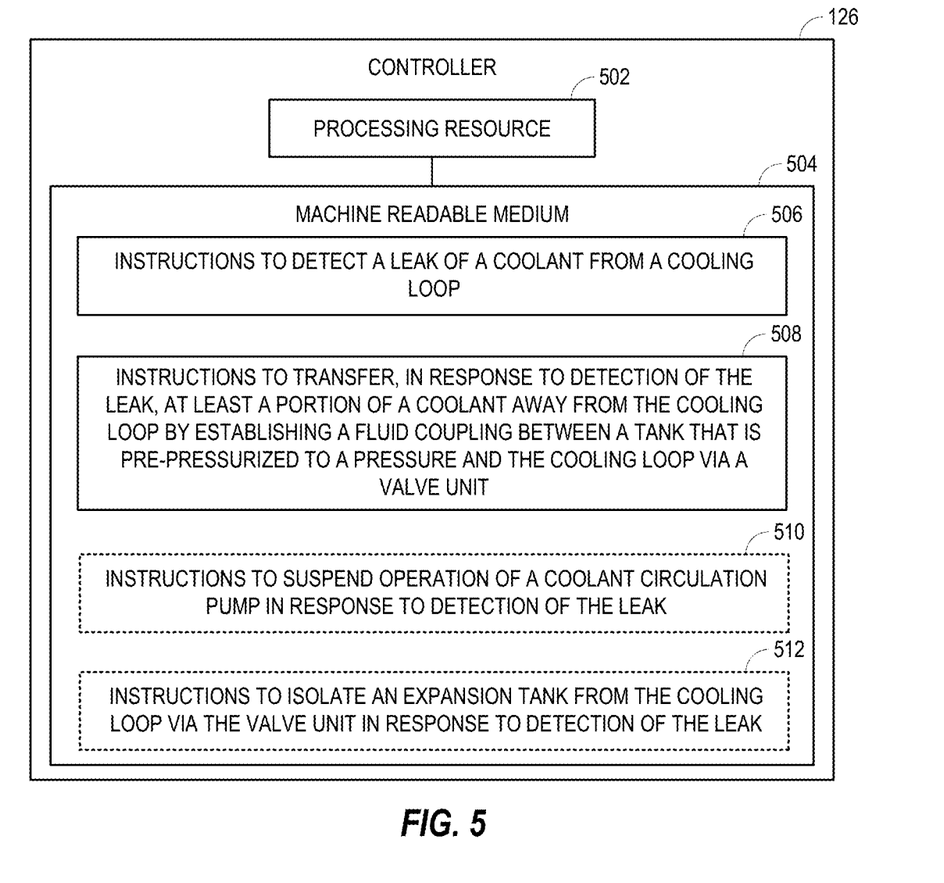
FIG. 5 is a block diagram of a controller used in a cooling system, in accordance with one example of the present disclosure.

FIG. 5 is a block diagram of a controller 126 used in a cooling system such as the cooling systems 104, 104A, or 104B, in accordance with one example of the present disclosure. The controller 126 may include a processing resource 502 and a machine readable medium 504. Non-limiting examples of the first processing resource 502 may include a microcontroller, a microprocessor, central processing unit core(s), an application-specific integrated circuit (ASIC), a field programmable gate array (FPGA), etc. The machine readable medium 504 is non-transitory and is alternatively referred to as a non-transitory machine readable medium 504. The machine readable medium 504 may be a storage medium, examples of which include, but are not limited to, a random access memory (RAM), a read-only memory (ROM), an electrically erasable programmable read-only memory (EEPROM), a flash memory, a hard disk drive, etc. The machine readable medium 504 may be encoded with example instructions to mitigate leakage of the coolant in one or more of the systems 100, 200, or 300. In some examples, the machine readable medium 504 may be accessed by the processing resource 502. Additionally or alternatively, the processing resource 502 may include electronic circuitry for performing the functionality described herein.

The machine readable medium 504 may be encoded with example instructions 506 and 508. In some implementations, the machine readable medium 504 may additionally include instructions 510 and 512. The instructions 506-512 of FIG. 5, when executed by the processing resource 502, may implement aspects of mitigating the leakage of the coolant in response to detection of the leak in the cooling loop 106, for example. In particular, the instructions 506-512 of FIG. 5 may be useful for performing the functionality of the controller 126 and at least a part of the methods described in FIGS. 6-7. Although not shown, the machine readable medium 504 may also be encoded with additional example instructions useful for performing the method described in FIG. 8 by the controller 126.

The instructions 506, when executed, may cause the processing resource 502 to detect a leak of the coolant from the cooling loop 106. Further, in some implementations, the instructions 508, when executed, may cause the processing resource 502 to establish, in response to detection of the leak, a fluid coupling between a tank (e.g., the LM tank 124, 124A, or 124B) and the cooling loop 106 via a valve unit (e.g., the valve unit 122, 122A, or 122B) to transfer at least a portion of the coolant away from the cooling loop 106. Furthermore, in some implementations, the instructions 510, when executed, may cause the processing resource 502 to suspend (i.e., shut-down) operation of the coolant circulation pump 114 in response to detection of the leak. Moreover, in some implementations, the instructions 512, when executed, may cause the processing resource 502 to isolate the expansion tank 208 from the cooling loop 106 via the valve unit in response to detection of the leak. Additional details of the functionalities performed by the controller 126 using such instructions are described in conjunction with the methods described in FIGS. 6-8.

Figure 6:
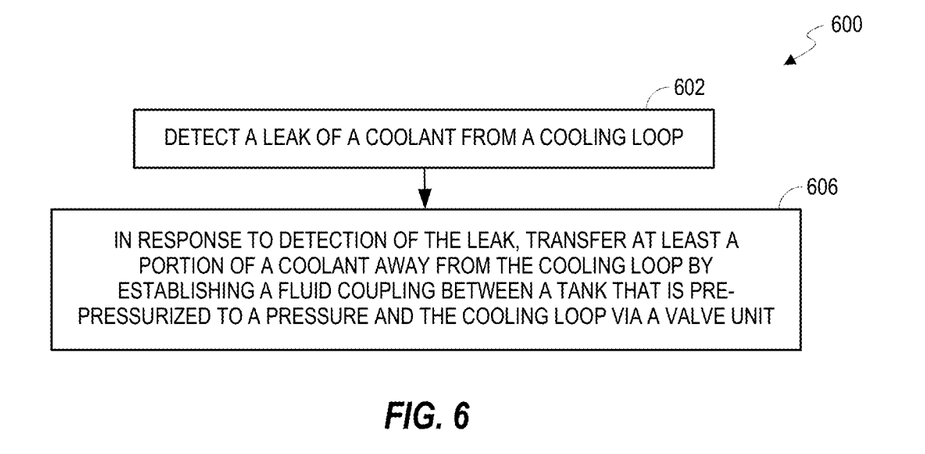
FIG. 6 is a flow diagram of a method for mitigating a leak of a coolant, in accordance with an example of the present disclosure.
Figure 7:
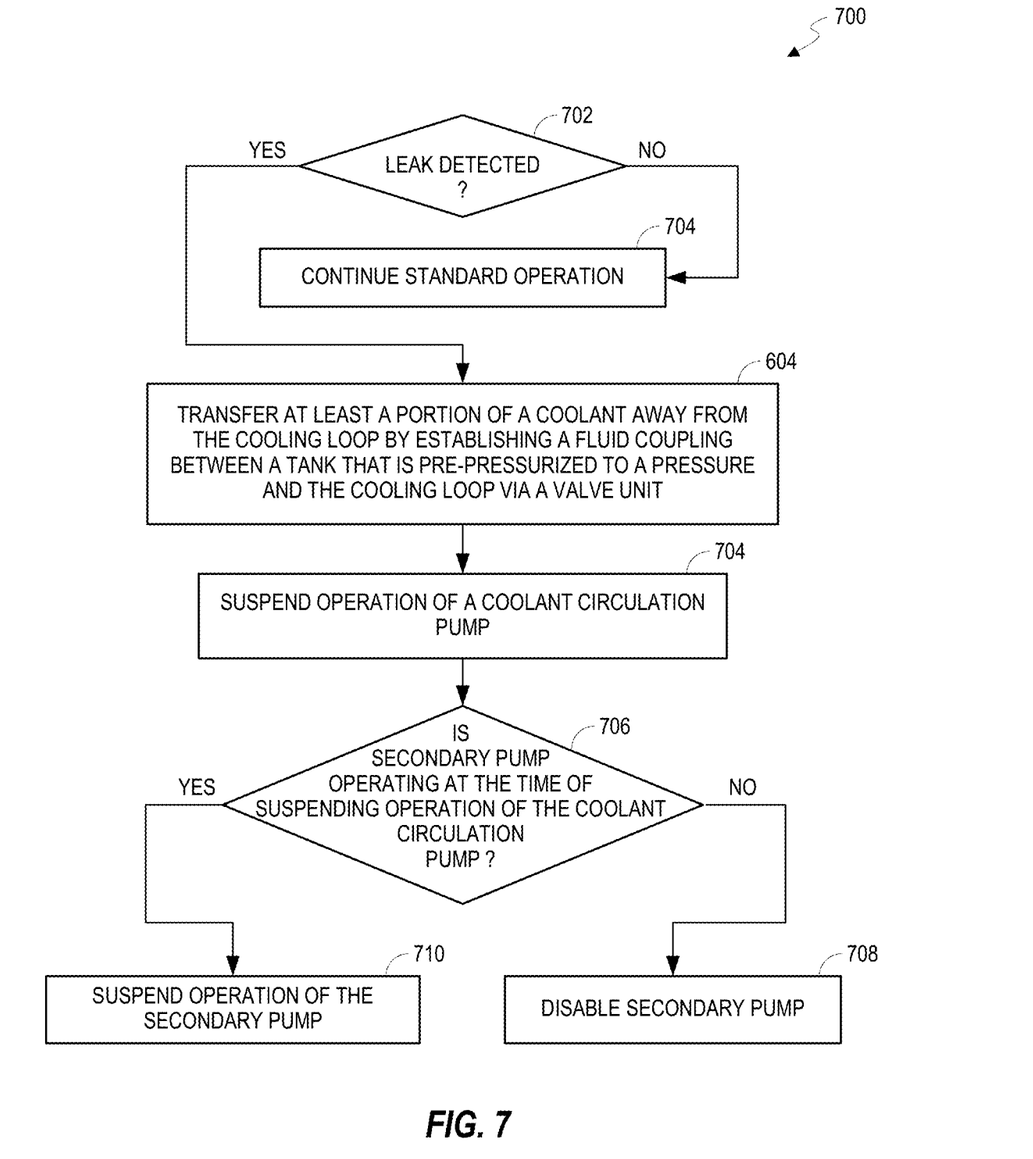
FIG. 7 is a flow diagram of a method for mitigating a leak of a coolant, in accordance with another example of the present disclosure.
Figure 8:
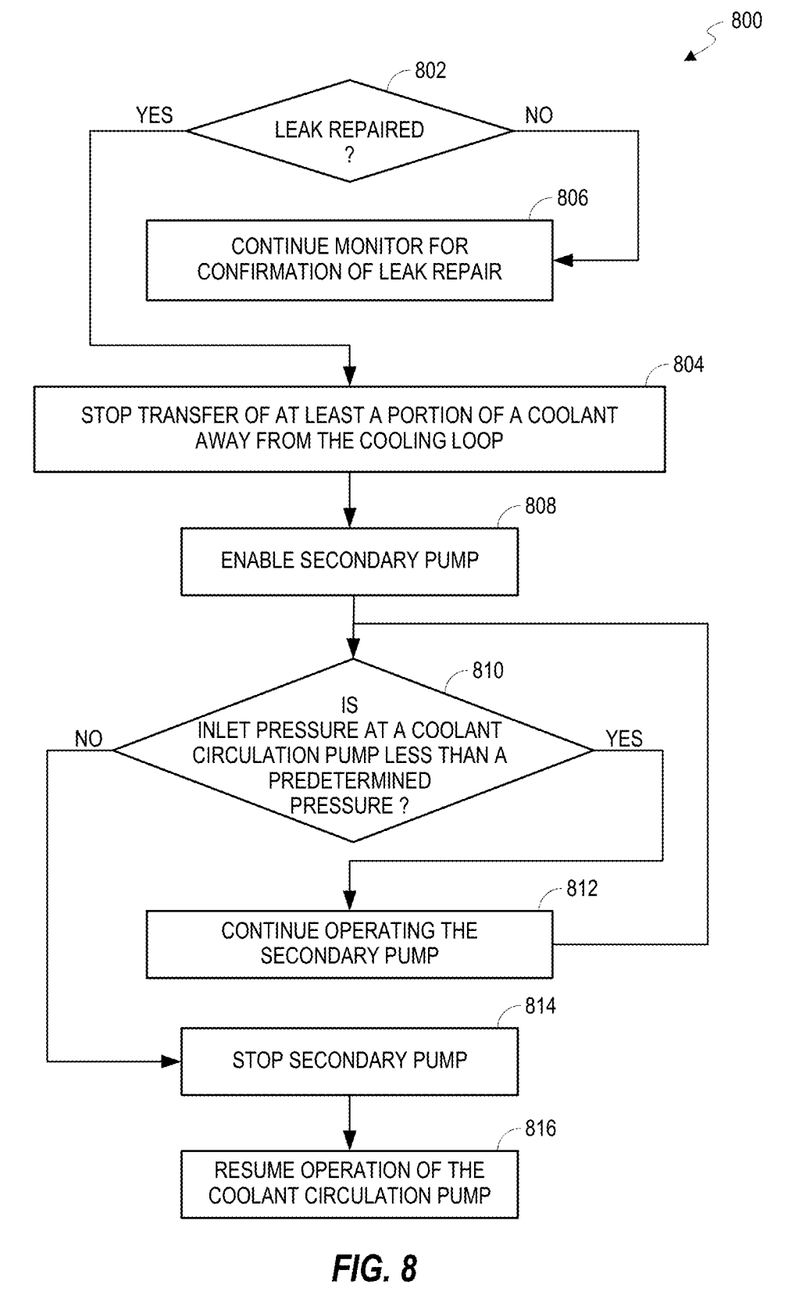
FIG. 8 is a flow diagram of a method for resuming operation of a cooling system, in accordance with another example of the present disclosure.

Referring now to FIGS. 6-8, flow diagrams depicting various example methods are presented. In some implementations, one or more blocks of these example methods may be executed substantially concurrently or in a different order than shown. In some implementations, a method may include more or fewer blocks than are shown. In some implementations, one or more of the blocks of these example methods may, at certain times, be ongoing and/or may repeat.

The methods of FIGS. 6-8 may be implemented via use of executable instructions stored on a machine readable medium (e.g., the machine readable medium 504) that are executable by a processing resource (e.g., such as processing resource 502) of the controller 126. Alternatively, the methods of FIGS. 6-8 may be implemented via use of electronic circuitry. In discussing FIGS. 6-8, reference is made to the cooling systems 104, 104A, 104B and the controller 126 of FIGS. 1-3 to provide contextual examples. Implementation, however, is not limited to those examples.

FIG. 6 is a flow diagram of a method 600 for mitigating a leak of a coolant, in accordance with an example of the present disclosure. At block 602, the method 600 includes detecting a leak of a coolant from a cooling loop, such as, the cooling loop 106. As noted earlier, various parameters such as pressure, flow rate, temperature, and/or conductivity of the coolant in the cooling loop 106 may be indicative of the leak of coolant from the cooling loop 106. Therefore, in some implementations, the controller 126 may monitor such parameters via one or more sensors/transducers (see FIGS. 2-3). The controller 126 may then determine existence of the leak of the coolant based on one or more of the pressure, flow rate, temperature, and/or conductivity of the coolant in the cooling loop 106. In particular, the controller 126 may compare measured values of these parameters with respective normal values and/or respective normal ranges. If the measured values of one or more of these parameters deviates from the respective normal values and/or respective normal ranges, the controller 126 may determine that there exists a leak in the cooling loop 106. The leak may occur at any position, for example, the supply line 108, the network of tubes 112, the return line 110, or any joints (fluid couplers—not shown) in the cooling loop 106. It may be noted that the present disclosure is not limited with respect techniques/methods for detecting the leak. Any suitable type of technique/method may be implemented to detect the leak of the coolant.

Further, in response to detection of the leak, at block 604, the method 600 includes transferring at least a portion of the coolant away from the cooling loop 106 by establishing a fluid coupling between a tank, such as, the LM tank (124, 124A, or 124B). By way of example, in the implementation of FIG. 2, the controller 126 may send control signals to the isolation valve 240 and the valve 128 such that the isolation valve 240 is operated in the second open state and the valve 128 is operated in the open state. When the isolation valve 240 is operated in the second open state and the valve 128 is operated in the open state, a fluid coupling between the LM tank 124A and the cooling loop 106 is established. When such fluid coupling is established, at least portion of the coolant from the cooling loop 106 is sucked by the LM tank 124A due the exposure of the cooling loop 106 to the vacuum pressure form the LM tank 124A.

In another example, in the implementation of FIG. 3, the controller 126 may send control signals to the valves 128A and the drain valve 310 such that the valves 128A and 310 are operated in open states. Therefore, when the valves 128A and 310 are operated in open states, a fluid coupling between the LM tank 124B and the cooling loop 106 is established via the venturi nozzle 312. When such fluid coupling is established, at least portion of the coolant from the cooling loop 106 is forced to exit via the venturi nozzle 312 and the drain conduit 314. In particular, a flow of the high-pressure fluid from the LM tank 1246 via the venturi nozzle 312 causes a suction force at the suction inlet 318 of venturi nozzle 312. Such a suction force may cause the coolant to enter into the venturi nozzle 312 via the suction inlet 318. The sucked coolant from the suction inlet 318 may flow along with the pressurized fluid from the LM tank 124B. The mixture of the high-pressure fluid and the coolant may enter into the drain conduit 314 from which the mixture may exit or collected in a drain collection unit 322. Additionally, in some examples, the controller 126 may also send control signals to the valve 128B so as to operate the valve 128B in closed state, thereby isolating the expansion tank 208 from the cooling loop 106.

Turning now to FIG. 7, a detailed method 700 for mitigating a leak of a coolant, in accordance with an example of the present disclosure. At block 702, a check may be performed by the controller 126 to detect the leak in the cooling loop 106. In general, the operations that may be performed by the controller 126 at block 702 to detect the leak have already described in block 602 of FIG. 6. At block 702, if it is determined that there exist no leak, normal operation of the cooling system, such as, the cooling system 104, 104A, or 104B continues. However, if the leakage of the coolant is detected at block 702, the controller 126 may proceed to execute method at block 604, described earlier.

Moreover, in response to detecting the leak, at block 704, the method 700 may include suspending operation of the coolant circulation pump 114. In order to suspend the operation of the coolant circulation pump 114, the controller 126 may send control signals/commands to the drive 204, for example, to shut-down the coolant circulation pump 114. The shutting-down of the coolant circulation pump 114 may stop the pressurization of the coolant and circulation of the coolant in the cooling loop 106. In this context, the term "shut-down" or "shutting-down" may refer to stop the coolant circulation pump 114 from pumping. In some examples, this may be accomplished by completely turning off (i.e., powering down) or cutting-off power to the coolant circulation pump 114. In other examples, the coolant circulation pump 114 may be shut-down by instructing the coolant circulation pump 114 to stop pumping, without necessarily completely powering-down the coolant circulation pump 114 (e.g., if the coolant circulation pump 114 includes a local controller, the local controller may remain powered on). As part of shutting-down the coolant circulation pump 114, the controller 126 may also disable the coolant circulation pump 114 to prevent it from starting pumping again (until the controller 126 determines it should resume operation).

At block 706, the controller 126 may determine whether the secondary pump 228 is operating at the time of suspending the operation of the coolant circulation pump 114. For example, the controller 126 may poll the secondary pump 228 to determine if the secondary pump 228 is operating to add additional coolant to the cooling loop 106 at the time of shut-down of the coolant circulation pump 114. As another example, the secondary pump 228 may be configured to notify the controller 126 of the secondary pump's 228 operating status (e.g., by asserting a signal line whenever the secondary pump 228 operates for the duration of its operation, or by sending a start message when the secondary pump 228 starts operating and a stop message when the secondary pump 228 stops operating, etc.), in which case the controller 126 may already have the information needed to determine whether the secondary pump 228 is currently operating.

If, at block 706, it is determined by the controller 126 that the secondary pump 228 is operating at the time of the shut-down of the coolant circulation pump 114, the controller 126 may suspend (i.e., shut-down) the operation of the secondary pump 228 as well at block 708. In some examples, at block 708, the controller 126 may shut-down the secondary pump 228 in parallel with the shut-down of the coolant circulation pump 114. As noted above, with respect to the secondary pump 228, the term "shut-down" or "shutting-down" may refer to stop the secondary pump 228 from pumping which may be accomplished by completely turning off (i.e., powering down) the secondary pump 228 or by instructing the secondary pump 228 to stop pumping without necessarily completely powering down the secondary pump 228. As part of shutting-down the secondary pump 228, the controller 126 may also disable the secondary pump 228 from starting pumping again (until the controller 126 determines the secondary pump 228 should resume operation).

If, at block 706, it is determined by the controller 126 that the secondary pump 228 is not running at the time of the shut-down of the coolant circulation pump 114, the controller 126 may disable the secondary pump 228 from starting at bock 710. The disabling of the secondary pump 228 may be accomplished by the controller 126 in response to a reading of a measured pressure from the pressure transducer 232 being less than the predetermined pressure. For example, the secondary pump 228 may include a local controller (not shown) that determines when to start and stop pumping by the secondary pump 228 based on the pressure measured by the pressure transducer 232. The controller 126 may disable the secondary pump 228 by instructing the local controller local controller of the secondary pump 228 to cease activating the secondary pump 228. As another example, the controller 126 may determine when the secondary pump 228 should turn on based on the pressure measured by the pressure transducer 232, in which case the controller 126 may disable the secondary pump 228 by refraining from causing the secondary pump 228 to turn-on. As another example, the secondary pump 228 may be disabled by powering down or cutting off power to the secondary pump 228.

Referring now to FIG. 8, a flow diagram of a method 800 for resuming operation of a cooling system (e.g., the cooling system 104A, 104B) is presented, in accordance with another example of the present disclosure. In some examples, the method 800 for resuming operation of a cooling system (e.g., the cooling system 104A, 104B) may be performed after a repair of the leak is performed.

At block 802, the controller 126 awaits confirmation regarding repair of the leak. The confirmation may be provided by an input received by the controller 126 from a system administrator. In another example, the input may be provided by a response to the controller 126 polling the sensors 234. In any event, if the controller 126 receives confirmation that the leak has been repaired or otherwise resolved, the controller 126 may stop transfer of the coolant away from the cooling loop, as indicated at block 804. In order to do so, in one implementation (see FIG. 2), the controller 126 may operate the isolation valve 240 in the first open state. The controller 126 may additionally operate the valve 128 in the closed state. In some examples, the when the isolation valve 240 is operated in the first open state, the LM tank 124A may be disconnected from the cooling loop 106 and the expansion tank 208 is fluidly coupled to the cooling loop 106. In some examples (i.e., FIG. 3), to stop the transfer of the coolant away from the cooling loop 106, the controller 126 may operate the valve 128A and the drain valve 310 in closed states. Additionally, the controller 126 may also reestablish a fluid coupling between the expansion tank 208 and the cooling loop 106 by operating the valve 128B in the open state. If the controller 126 does not receive confirmation of the leak repair at block 802, the controller 126 continues to monitor for confirmation of the repair of the leak as indicated at block 806.

In block 808, the controller 126 re-enables the secondary pump 228 to resume normal operation. In this context, the normal operation of the secondary pump 228 includes the secondary pump 228 starting and stopping its pumping based on the pressure at the pump inlet 116. Specifically, once re-enabled, the secondary pump 228 starts pumping when the pressure at the pump inlet 116 is less than the predetermined pressure. For example, if the operation of the secondary pump 228 is controlled by a local controller, the controller 126 may re-enable the secondary pump 228 by instructing the local controller to resume normal operation, whereupon the local controller determines whether to start/stop pumping based on the pressure at the pump inlet 116. As another example, if the controller 126 directly controls the operation of the secondary pump 228, then the controller 126 may re-enable the secondary pump 228 by resuming controlling the secondary pump 228 based on the pressure at the pump inlet 116. As another example, if the secondary pump 228 was disabled by powering down or cutting off power to the secondary pump 228, the secondary pump 228 may be re-enabled by restoring power to the secondary pump 228.

Further, at block 810, the controller 126 monitors the inlet pressure at the pump inlet 116 via the pressure transducer 232 to determine if the inlet pressure at the pump inlet 116 of the coolant circulation pump 114 is less than the predetermined pressure. At block 810, if it is determined that the inlet pressure is less than the predetermined pressure, the secondary pump 228 continues pumping the coolant into the coolant loop 106, according to normal operational principles of the secondary pump 228, to increase the pressure at the pump inlet 116, as indicated at block 812. The controller 126 continues to perform check at per block 810, until the inlet pressure reaches the predetermined pressure. At block 810, if it is determined that the inlet pressure is not less than the predetermined pressure, at block 814, the secondary pump 228 may be stopped to cease pumping additional coolant and the process may continue to block 816. At block 816, the controller 126 activates the coolant circulation pump 114 to resume circulation of the coolant through the cooling loop 106.

In the foregoing description, numerous details are set forth to provide an understanding of the subject matter disclosed herein. However, implementation may be practiced without some or all of these details. Other implementations may include modifications, combinations, and variations from the details discussed above. It is intended that the following claims cover such modifications and variations.

What is claimed is:

1. A leak mitigation system, comprising:
   a tank that is to, in operation, be pre-evacuated to a vacuum pressure;
   a valve unit fluidly coupled to the tank and a cooling loop, wherein the cooling loop comprises one or more tubes to facilitate a flow of a coolant to cool one or more computing devices; and
   a controller operatively coupled to the valve unit, wherein the controller:
   detects a leak of the coolant from the cooling loop; and
   in response to detection of the leak, operates the valve unit to establish a fluid coupling between the tank and the cooling loop to transfer at least a portion of the coolant away from the cooling loop, wherein the valve unit is fluidly coupled between the tank and the cooling loop to allow flow of fluid between the tank and the cooling loop via the valve unit when the valve unit is operated to establish the fluid coupling between the tank and the cooling loop, wherein at least the portion of the coolant is transferred to the tank from the cooling loop as a result of exposure to the vacuum pressure when the fluid coupling between the tank and the cooling loop is established via the valve unit.

2. The leak mitigation system of claim 1, wherein the one or more computing devices are disposed in a plurality of racks, and wherein the tank comprises a plurality of tanks distributed across the plurality of racks.

3. The leak mitigation system of claim 1, wherein the cooling loop further comprises a coolant circulation pump to enable the flow of the coolant in the cooling loop, wherein the controller is operatively coupled to the coolant circulation pump.

4. The leak mitigation system of claim 3, wherein the controller suspends operation of the coolant circulation pump in response to detection of the leak.

5. The leak mitigation system of claim 1, wherein the cooling loop is coupled to an expansion tank via the valve unit.

6. The leak mitigation system of claim 5, wherein the controller isolates an expansion tank from the cooling loop via the valve unit in response to the detection of the leak.

7. A method, comprising:
 detecting a leak of a coolant from a cooling loop, wherein the cooling loop comprises one or more tubes to facilitate a flow of the coolant to cool one or more computing devices; and
 in response to detection of the leak, transferring at least a portion of the coolant away from the cooling loop by establishing a fluid coupling between a tank that is pre-pressurized to a pressure and the cooling loop via a valve unit, wherein the valve unit is fluidly coupled between the tank and the cooling loop to allow flow of fluid between the tank and the cooling loop via the valve unit when the valve unit is operated to establish the fluid coupling between the tank and the cooling loop, wherein the pressure is a vacuum pressure and the tank is pre-evacuated to the vacuum pressure, and wherein transferring at least the portion of the coolant away from the one or more tubes comprises transferring at least the portion of the coolant from the cooling loop into the tank as a result of exposure to the vacuum pressure when the fluid coupling between the tank and the cooling loop is established via the valve unit.

8. The method of claim 7, further comprising suspending operation of a coolant circulation pump in response to detection of the leak, wherein the coolant circulation pump is disposed in the cooling loop to enable the flow of the coolant in the cooling loop.

9. The method of claim 7, further comprising isolating an expansion tank from the cooling loop via the valve unit in response to detection of the leak, wherein the expansion tank is fluidly coupled to the cooling loop via the valve unit.

10. A non-transitory machine readable medium storing instructions executable by a processing resource, the instructions comprising: instructions to detect a leak of a coolant from a cooling loop, wherein the cooling loop comprises one or more tubes to facilitate a flow of the coolant to cool one or more computing devices; and instructions to establish, in response to detection of the leak, a fluid coupling between a tank and the cooling loop via a valve unit to transfer at least a portion of the coolant away from the cooling loop, wherein the tank is pre-evacuated to a vacuum pressure, and wherein the valve unit is fluidly coupled between the tank and the cooling loop to allow flow of fluid between the tank and the cooling loop via the valve unit when the valve unit is operated to establish the fluid coupling between the tank and the cooling loop, wherein transferring at least the portion of the coolant away from the one or more tubes comprises transferring at least the portion of the coolant from the cooling loop into the tank as a result of exposure to the vacuum pressure when the fluid coupling between the tank and the cooling loop is established via the valve unit.

11. The non-transitory machine readable medium of claim 10, further comprising instructions to suspend operation of a coolant circulation pump in response to detection of the leak, wherein the coolant circulation pump is disposed in the cooling loop to facilitate a flow of the coolant in the cooling loop.

12. The non-transitory machine readable medium of claim 10, further comprising instructions to isolate an expansion tank from the cooling loop via the valve unit in response to detection of the leak, wherein the expansion tank is fluidly coupled to the cooling loop via the valve unit.

* * * * *